United States Patent
Xiao et al.

(10) Patent No.: US 9,625,519 B2
(45) Date of Patent: Apr. 18, 2017

(54) DRIVE FAILURE PROTECTION

(71) Applicant: ROCKWELL AUTOMATION TECHNOLOGIES, INC., Mayfield Heights, OH (US)

(72) Inventors: Yuan Xiao, Ontario (CA); Lixiang Wei, Whitefish Bay, WI (US); Doyle F. Busse, Jackson, WI (US)

(73) Assignee: ROCKWELL AUTOMATION TECHNOLOGIES, INC., Mayfield Heights, OH (US)

( * ) Notice: Subject to any disclaimer, the term of this patent is extended or adjusted under 35 U.S.C. 154(b) by 562 days.

(21) Appl. No.: 14/159,258

(22) Filed: Jan. 20, 2014

(65) Prior Publication Data

US 2014/0132295 A1 May 15, 2014

Related U.S. Application Data

(63) Continuation of application No. 13/016,111, filed on Jan. 28, 2011, now Pat. No. 8,643,383.

(51) Int. Cl.
*G01R 31/34* (2006.01)
*H01G 2/12* (2006.01)
(Continued)

(52) U.S. Cl.
CPC ....... *G01R 31/2843* (2013.01); *H02H 7/1203* (2013.01); *H02H 7/16* (2013.01);
(Continued)

(58) Field of Classification Search
CPC . G01R 31/2843; G01R 31/42; H02P 29/0241; H02M 1/42; H02M 5/458;
(Continued)

(56) References Cited

U.S. PATENT DOCUMENTS 3,859,564 A 1/1975 Zulaski
3,909,672 A 9/1975 Lundquist et al.
(Continued)

FOREIGN PATENT DOCUMENTS

| CN | 2039071 | 6/1989 |
|---|---|---|
| CN | 101609977 | 12/2009 |
| SU | 922946 | 4/1982 |

OTHER PUBLICATIONS

Office Action for Chinese Application No. 2011210020869.3 issued Dec. 4, 2013.
(Continued)

*Primary Examiner* — Farhana Hoque
(74) *Attorney, Agent, or Firm* — Fletcher Yoder, P.C.

(57) ABSTRACT

The present techniques include methods and systems for detecting a failure in a capacitor bank of an electrical drive system. Embodiments include using discharge resistors to discharge capacitors in the capacitor bank, forming a neutral node of the capacitor bank. In different capacitor configurations, the neutral node is measured, and the voltage is analyzed to determine whether a capacitor bank unbalance has occurred. In some embodiments, the node is a neutral-to-neutral node between the discharged side of the discharge resistors and a neutral side of the capacitor bank, or between the discharged side of the discharge resistors and a discharged side of a second set of discharge resistors. In some embodiments, the node is a neutral-to-ground node between the discharged side of the discharge resistors and a ground potential.

23 Claims, 9 Drawing Sheets

(51) Int. Cl.
  *G01R 31/28* (2006.01)
  *H02H 7/12* (2006.01)
  *H02H 7/16* (2006.01)
  *H02J 3/18* (2006.01)
  *H02M 5/458* (2006.01)
  *H02M 1/42* (2007.01)
  *H02P 29/024* (2016.01)
  *H02H 7/08* (2006.01)
  *G01R 31/42* (2006.01)
  *H02J 3/26* (2006.01)

(52) U.S. Cl.
  CPC ............ *H02J 3/1821* (2013.01); *H02M 1/42* (2013.01); *H02M 5/458* (2013.01); *H02P 29/0241* (2016.02); *G01R 31/42* (2013.01); *H02H 7/0811* (2013.01); *H02J 3/26* (2013.01); *Y02E 40/30* (2013.01); *Y02E 40/50* (2013.01)

(58) Field of Classification Search
  CPC ...... H02H 7/0811; H02H 7/1203; H02H 7/16; H02J 3/1821; H02J 3/26; Y02E 40/30; Y02E 40/50
  USPC .............................. 324/765.01, 750.3; 361/17
  See application file for complete search history.

(56) References Cited

U.S. PATENT DOCUMENTS

| | | | |
|---|---|---|---|
| 4,104,687 A | * | 8/1978 | Zulaski ............... H02H 7/16 361/15 |
| 5,087,999 A | | 2/1992 | Sato et al. |
| 2007/0105183 A1 | * | 5/2007 | Nakatani .......... G01N 33/48728 204/403.01 |

OTHER PUBLICATIONS

Bishop, Martin, "A Primer on Capacitor Bank Protection," IEEE Transactions Industry Applications, vol. 37, No. 4, Jul./Aug. 2001.
Extended European Search Report for European Application No. 12153008.3 dated Jun. 29, 2012.

* cited by examiner

DRIVE FAILURE PROTECTION

CROSS-REFERENCES TO RELATED APPLICATIONS

This application is a continuation of U.S. patent application Ser. No. 13/016,111, filed on Jan. 28, 2011, the full disclosure of which is incorporated herein by reference.

BACKGROUND

The invention relates generally to the field of electrical drives. More particularly, the invention relates to techniques for detecting drive conditions for capacitor bank protection.

Various power systems include power conversion systems such as electric drives and motors which are employed to convert electrical energy into mechanical energy. An electric drive includes a device or group of devices which controls the torque, speed, position, and/or performance of an electric motor. The drive may be connected to a power source such as a battery, a power supply, or an AC generator, and may control the transmission of power from the power source to the motor, which converts the electrical power into mechanical power.

Electrical drives typically include capacitor banks connected in series and/or in parallel to power input lines of a particular drive. Traditionally, a capacitor bank provides reactive power which decreases the current in the upstream lines of the capacitor bank to improve the voltage and power factor of an associated electrical drive. Improving the voltage and power factor of the drive reduces line losses in the drive, thereby improving the efficiency and performance of the drive. Capacitor banks may also be configured as LCL filters for reducing harmonics from alternating currents that power the drive. Capacitor banks often cooperate with additional features to facilitate drive protection. Generally, capacitor banks are coupled with fuses, surge arresters, and protective relays for protecting the electrical drive.

During the operation of the electrical drive, capacitor banks may be susceptible to becoming unbalanced. For example, an unbalanced condition may occur if one of the capacitor units in the capacitor bank fails, or if a fuse operation occurs in a fused bank. Such conditions may result in high voltages on the remaining capacitor units, which may cause damage to the remaining capacitor units or any associated components.

Some drives involve unbalance detection schemes which detect such unbalanced conditions in capacitor banks Existing methods are typically suitable for detecting unbalanced conditions in certain configurations of capacitor banks (e.g., in grounded and ungrounded system shunt capacitor banks) However, not all types of electrical drives use the same type of capacitor bank configuration. In fact, electrical drives are used for a wide range of industrial applications, and different applications typically use drives having different capacitor bank configurations. For instance, an electrical drive suitable for relatively lower power configurations may use a capacitor bank configuration that is corner-connected. Typical unbalance detection schemes configured for Y-connected capacitor banks may not be suitable for corner connected capacitor banks

BRIEF DESCRIPTION

The present invention relates generally to techniques for detecting unbalances in the capacitor bank of an electrical drive. Specifically, the unbalance detection scheme may be suitable for detecting unbalances in different electrical drives having different capacitor bank configurations. Some embodiments include implementing one or more sets of discharge resistors to discharge the capacitor bank and form a neutral node of the capacitor bank. In different embodiments, this node may be a neutral-to-neutral node or a neutral-to-ground node. Embodiments further include measuring a voltage at the node to determine a condition (e.g., normal operation or unbalance) of the capacitor bank.

DRAWINGS

These and other features, aspects, and advantages of the present invention will become better understood when the following detailed description is read with reference to the accompanying drawings in which like characters represent like parts throughout the drawings, wherein.

Figure 8:
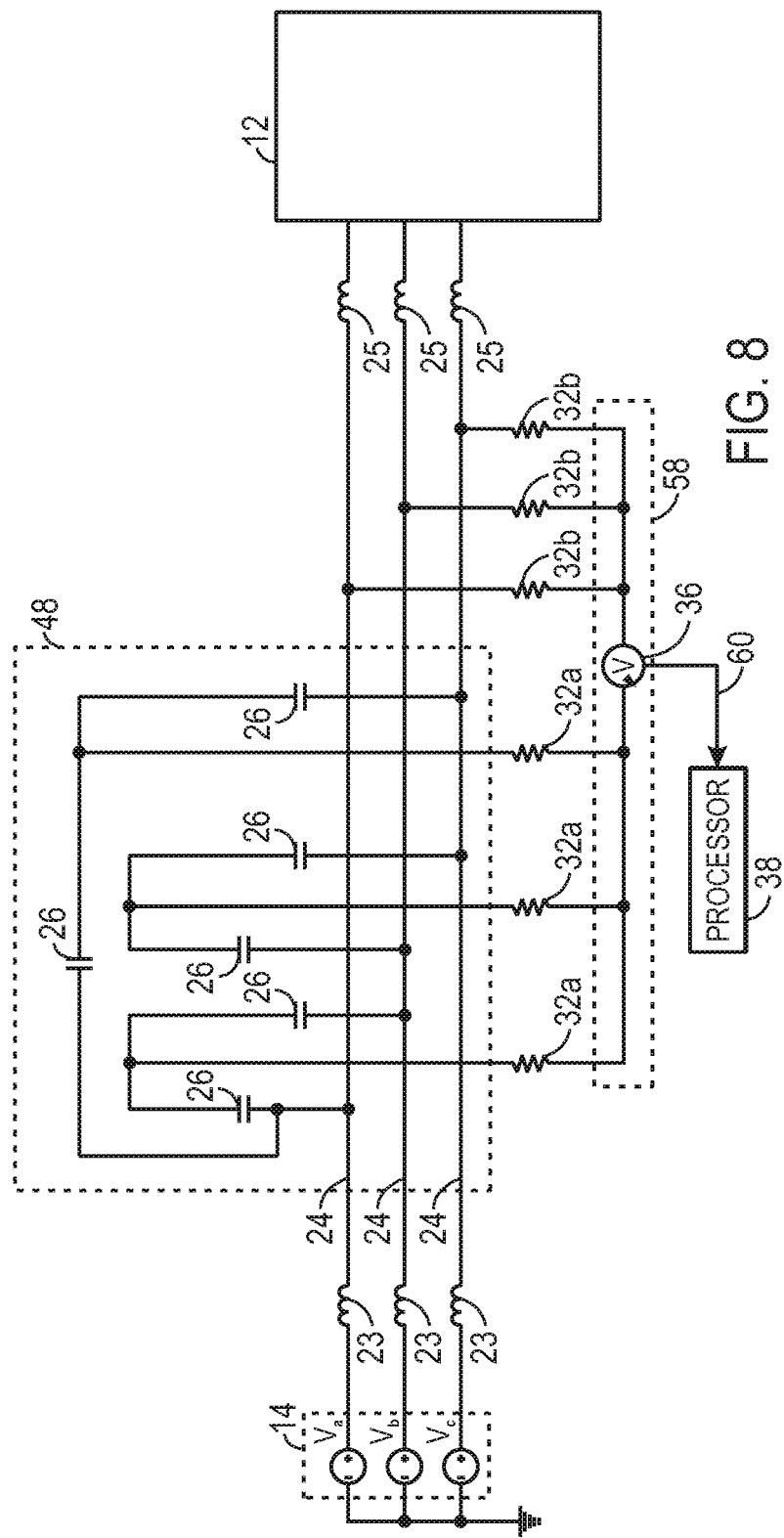
FIG. 8 is a circuit diagram representing a method for measuring the neutral-to-neutral voltage in a corner connected capacitor bank, in accordance with an embodiment of the present techniques.
Figure 9:
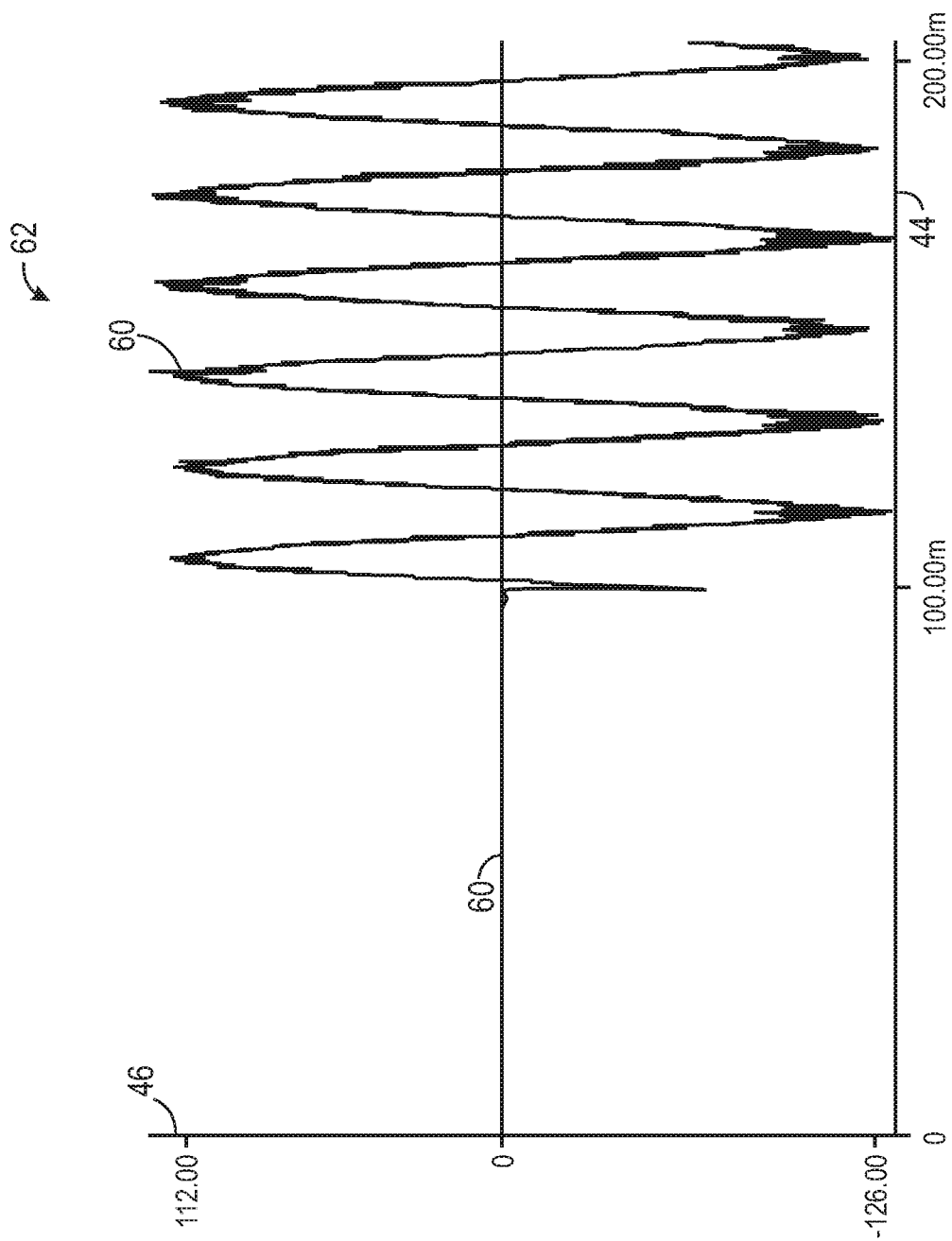
Figure 10:
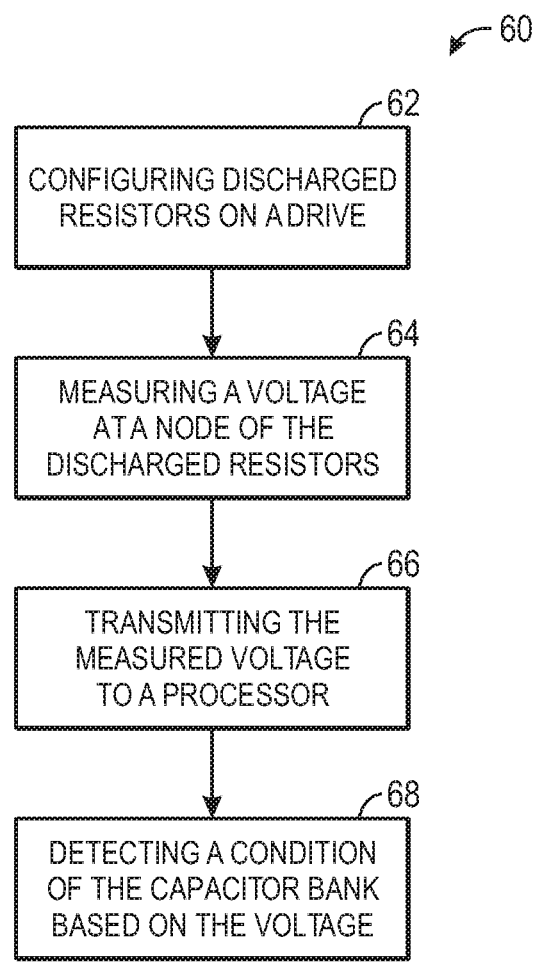

FIG. 9 is a plot representing a voltage condition of a neutral-to-neutral node when a capacitor bank unbalance has occurred in the corner connected capacitor bank, wherein the voltage condition is measured from the circuit illustrated in FIG. 8, in accordance with an embodiment of the present techniques; and FIG. 10 is a flowchart illustrating one or more embodiments for detecting unbalances in a capacitor of a drive, in accordance with an embodiment of the present techniques.

DETAILED DESCRIPTION

The present invention relates generally to techniques for detecting capacitor bank unbalances in drives having different capacitor bank configurations. Embodiments include systems and methods of measuring drive voltages to determine when and/or whether a capacitor bank unbalance has occurred. Some embodiments involve configuring discharge resistors to a capacitor bank and measuring a neutral-to-ground voltage or a neutral-to-neutral voltage at the capacitor bank. The discharge resistors are installed in different locations and may have different resistances, depending on the configuration of the capacitor bank and/or the drive.

Figure 1:
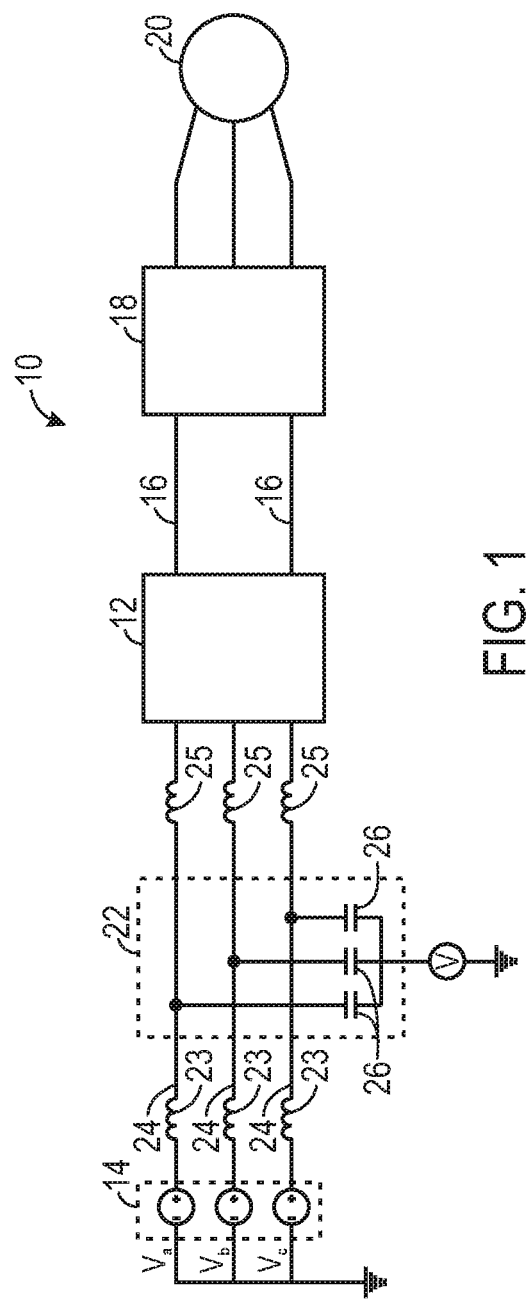
FIG. 1 is a circuit diagram of an application of an electrical drive system, in accordance with an embodiment of the present techniques.

Turning to the figures, FIG. 1 depicts an exemplary application of a drive system 10 which may be used for various applications. The drive system 10, also referred to as the drive 10, includes a converter 12 configured to receive an alternating current from one or more power sources 14 and to convert the alternating current (AC) to direct current (DC) applied to a DC bus 16. The drive 10 also includes an inverter 18 which receives the DC power through the DC bus 16 and converts DC power from the DC bus 16 to output AC power. A motor 20 connected to the inverter 18 is driven by the AC power converted by the inverter 18. Depending on the electrical system in which the drive 10 is operating, different types of power may be needed to drive the motor 20. In one embodiment, the electrical drive system 10 also includes a capacitor bank 22 configured to filter harmonics associated with the DC bus 16. While the illustrated embodiment depicts three-phase voltages, it should be noted that in different embodiments, the drive 10 may be suitable for inputting and outputting voltages of different phases (e.g., single phase voltage, two-phase voltages).

Each capacitor 26 of the capacitor bank 22 is connected in series to a respective power input line 24 of the drive 10 and connected in parallel with the other capacitors 26 of the capacitor bank 22. While the illustrated embodiment includes one capacitor bank 22 with several capacitor units 26, in some embodiments, more than one capacitor bank 22 may be used in each drive 10. The capacitor bank 22 stores a portion of the AC power from the power source 14 and return the stored energy to the power source 14 in each cycle. This returned power, referred to as reactive power, decreases the current in the power input lines 24, and improves the voltage and power factor of the drive 10. Improving the voltage and power factor reduces line losses in the drive 10, thereby improving the efficiency and performance of the drive 10. The capacitor banks 22 may also be configured as LCL filters for reducing harmonics from the alternating currents in the power input lines 24 of the drive 10. As illustrated in FIG. 1, in some embodiments, the capacitor bank 22 is connected between two sets of inductors 23, 25 in an LCL filter configuration.

During the operation of the drive system 10, the capacitor bank 22 may be susceptible to line transient responses or other undesirable conditions. As a result, an unbalanced condition may occur if one of the capacitor units 26 in the capacitor bank 22 fails, or a capacitor bank 22 in a group of multiple capacitor banks fails. Unbalanced conditions may also occur if a fuse operation occurs in a fused bank. Such unbalanced conditions may result in relatively high voltages on the remaining capacitor units 26 or remaining capacitor banks 22, which may cause damage to the capacitor units 26, the capacitor bank 22, and/or any associated components. For example, when remaining capacitor units 26 are subjected to relatively high voltages, input harmonics may be significantly increased such that the drive system 10 may no longer operate within harmonics thresholds. Furthermore, a catastrophic drive failure may result if high voltages are not immediately reduced from the remaining capacitor units 26.

Figure 2:
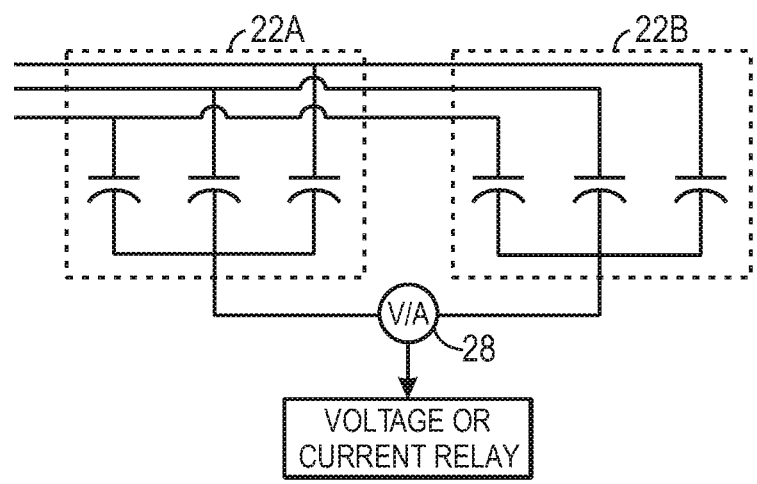
FIG. 2 is a circuit diagram of a typical method for measuring the neutral voltage or current between two Y connected capacitors that may be utilized with embodiments of the present technique.
Figure 3:
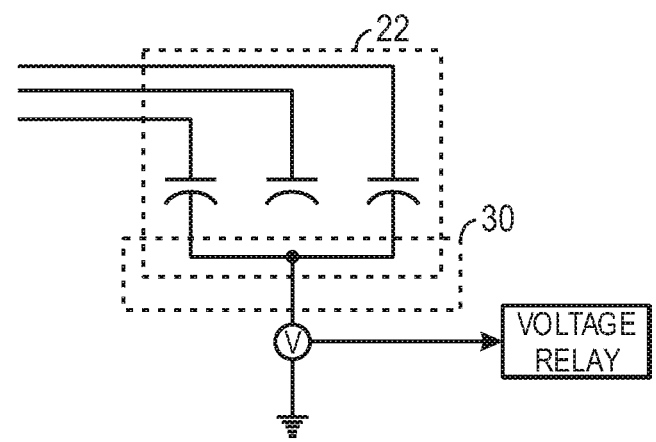
FIG. 3 is a circuit diagram representing a typical method for measuring the neutral-to-ground voltage of a Y connected capacitor bank that may be utilized with embodiments of the present technique.

Some drives involve unbalance detection schemes which detect unbalanced conditions in capacitor banks Existing methods are typically suitable for detecting unbalanced conditions in certain configurations of capacitor banks, such as grounded and ungrounded Y-connected shunt capacitor banks For example, as illustrated in FIG. 2, the current or the voltage difference between two parallel capacitor banks 22a, 22b is measured at node 28 to determine whether an unbalance has occurred. Another example of a typical unbalance protection scheme involves monitoring the neutral-to-ground voltage of the capacitor bank 22 in a Y-connected configuration, as illustrated in FIG. 3. As the neutral-to-ground voltage is measured from a neutral node 30 of the Y-connected capacitor bank 22 of FIG. 3, under normal operating conditions, the neutral-to-ground voltage is approximately zero. A failure is determined to have occurred when the neutral-to-ground voltage is not approximately zero.

While typical unbalance detection schemes can function for certain types of Y-connected capacitor banks, such methods are not suitable for different types of drives having differently configured capacitor banks For example, an unbalance detection scheme for the circuit represented in FIG. 2 typically requires the two capacitor banks 22a and 22b to be in parallel, such that unbalances can be detected between the two parallel capacitor banks 22a and 22b. Furthermore, an unbalance detection scheme for the circuit represented in FIG. 3 detects unbalances based on non-zero voltage measurements at a neutral-to-ground node 30. Therefore, such schemes generally are used when the grounding configuration of a system is known. Furthermore, such conventional schemes may be used when the capacitor bank has a neutral node from which voltage measurements are taken. However, not every type of drive utilizes two capacitor banks, and not every type of capacitor bank configuration has a neutral node for neutral-to-ground voltage measurements or neutral-to-neutral voltage measurements. For instance, corner connected capacitors are typically preferred for drive systems 10 suitable for lower power industrial applications due to its cost and size. The typical methods explained with respect to FIGS. 2 and 3 may not be suitable as unbalance detection schemes for corner connected capacitor banks, as corner connected capacitor banks do not generally have a neutral node. Detecting unbalances from voltages measured at non-neutral nodes is generally difficult.

Figure 4:
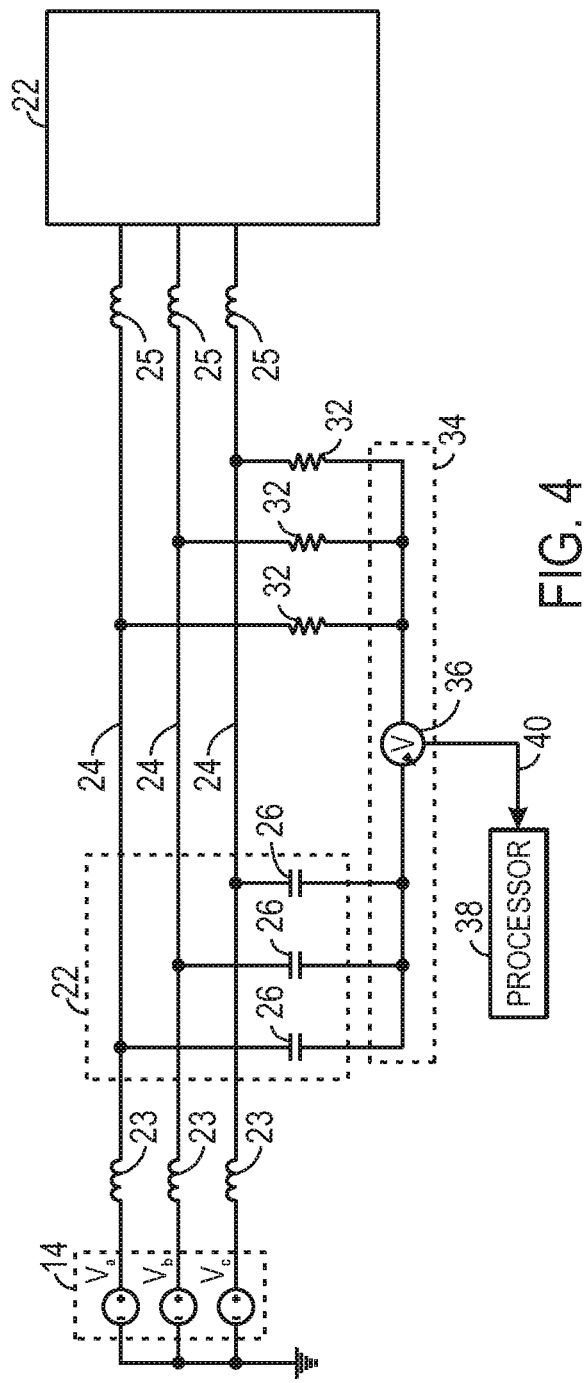
FIG. 4 is a circuit diagram representing a circuit for measuring the neutral-to-neutral voltage in a drive having a Y connected capacitor bank, in accordance with an embodiment of the present techniques.

In some embodiments of the present disclosure, one or more discharge resistors are used to create a neutral node in a capacitor bank of a drive for improved unbalance detection in differently configured capacitor banks A portion of the drive 10 (FIG. 1) illustrated in FIG. 4 includes the capacitor bank 22 in a Y-connected configuration and discharge resistors 32. Each of the discharge resistors 32 is connected in parallel to a capacitor 26 in the capacitor bank 22. The discharge resistors 32 are configured to discharge the capacitors 26 in a certain amount of time. Since the discharge resistors 32 are configured to discharge the capacitors 26 in the capacitor bank 22 after the drive system 10 is shut down, a neutral node 34 is created between the capacitor bank 22 and a discharged side (e.g., the side of the resistors 32 opposite from power input lines 24) of the discharge resistors 32. As the discharge resistors 32 create a neutral node 34 on the capacitor bank 22, a second capacitor bank 22 is not necessary for the purpose of creating a neutral node. In applications where only one capacitor bank 22 is necessary (e.g., lower power drive applications), such a configuration may result in substantial improvements in drive cost, complexity, and/or operating efficiency.

A voltage measured at the neutral node 34 (e.g., by a voltmeter 36), referred to as a neutral-to-neutral voltage, is approximately zero when the capacitor bank 22 is operating under normal conditions. When the neutral-to-neutral voltage is not zero, then a fault may have occurred. In some embodiments, a processor 38 may receive the neutral-to-neutral voltage 40, or a signal 40 indicative of the neutral-to-neutral voltage and determine when or if a fault has occurred. As used herein, the processor 38 refers to any machine capable of performing the calculations, or computations, necessary to perform the tasks of the inventions, such as controlling the measurement of drive voltages, analyzing the measurements, indicating an analysis of the measurements, etc. In some embodiments, the processor 38 (also used in FIGS. 6 and 8, as will be discussed) is configured (e.g., programmed) to determine what type of fault has occurred or where the fault has occurred, based on an analysis of the neutral-to-neutral voltage 40. The processor 38 then reacts to the fault condition. For example, in some embodiments, the processor 38 shunts one or more elements (e.g., a capacitor 26 or a capacitor bank 22), shuts down the entire drive 10 in which the fault occurs, and/or provides an indication (e.g., to a user) regarding the fault condition.

Figure 5:
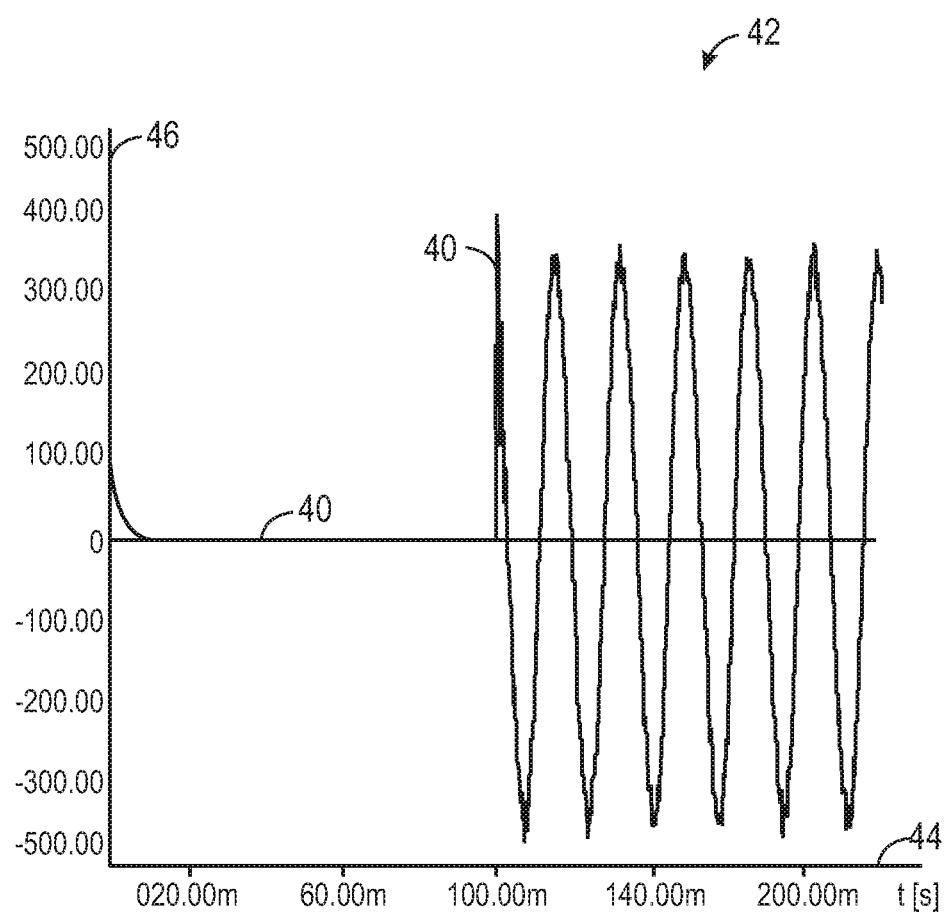
FIG. 5 is a plot representing a voltage condition of a neutral-to-neutral node when a capacitor bank unbalance has occurred, wherein the voltage condition is measured from the circuit illustrated in FIG. 4, in accordance with an embodiment of the present techniques.

FIG. 5 is a plot 42 of the neutral-to-neutral voltage 40 measured at the neutral node 34 in FIG. 4, with respect to a time axis 44 and a voltage axis 46. Before the 100 ms point, the neutral-to-neutral voltage 40 is approximately zero, indicating that the capacitor bank 22 is operating normally. After the 100 ms point, the neutral-to-neutral voltage 40 is no longer zero and begins to oscillate between approximately 350V to −350V. This non-zero neutral-to-neutral voltage 40 indicates that at least one phase of the capacitor bank 22 is no longer operating normally. The processor 38 detects this change and determines that a fault has occurred.

Figure 6:
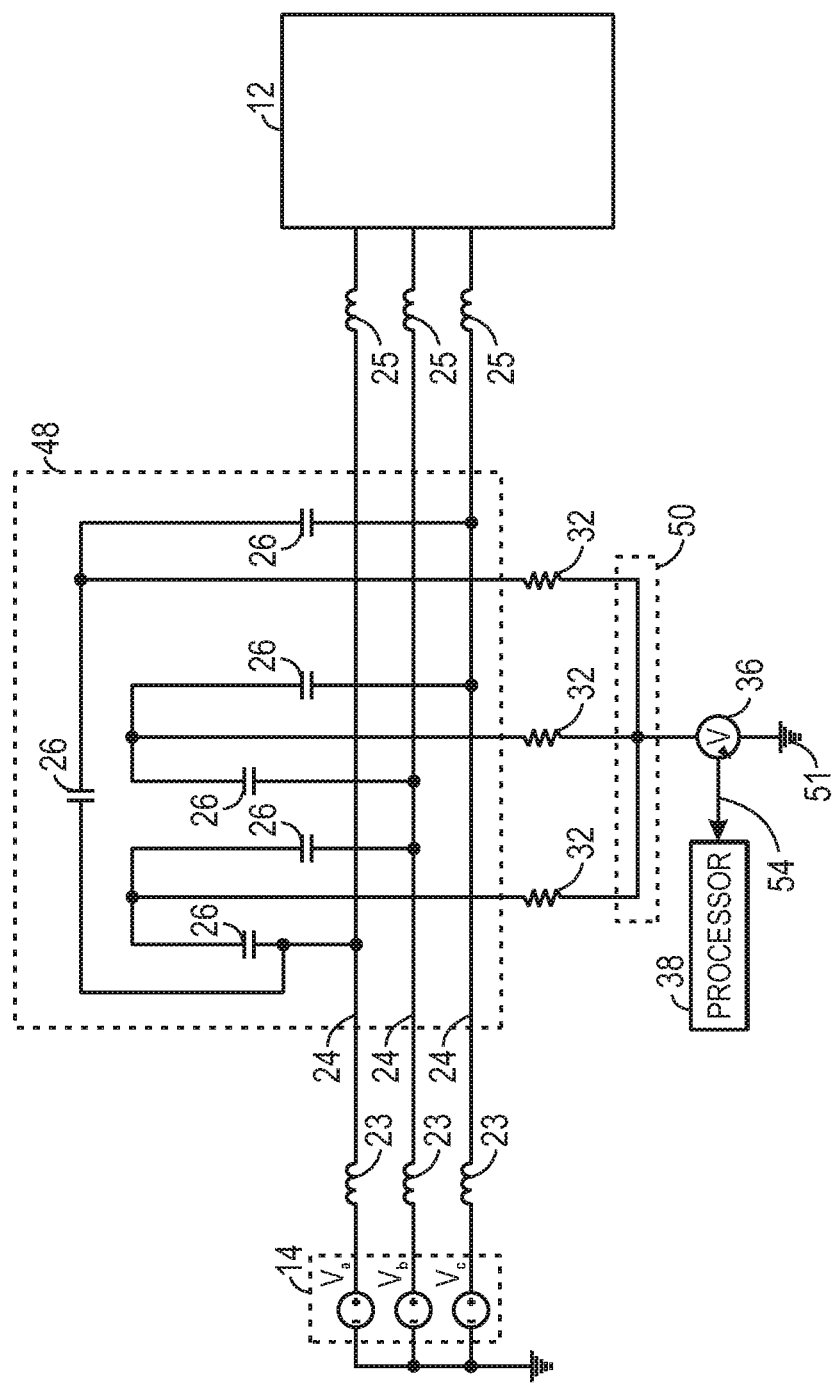
FIG. 6 is a circuit diagram representing a circuit for measuring the neutral-to-ground voltage in a corner connected capacitor bank, in accordance with an embodiment of the present techniques.

The present techniques involving using discharge resistors 32 are also suitable for differently configured capacitor banks As illustrated in FIG. 6, discharge resistors 32 are connected to a drive having a corner connected capacitor bank 48. As discussed, unlike Y-connected capacitor banks 22, typical corner connected capacitor banks 48 do not have a neutral node. However, in some embodiments, the discharge resistors 32 are connected in series to two capacitors 26 in the corner connected capacitor bank 48. The discharge resistors 32 discharge the capacitors 26 in the corner connected capacitor bank 48, creating a neutral node 50 between the discharged side (e.g., the side of the discharge resistors 32 opposite from the capacitors 26) of the discharge resistors 32 and a ground potential 51. A voltage measured at the neutral node 50 (e.g., by a voltmeter 36), referred to as a neutral-to-ground voltage, is analyzed to determine the condition of the capacitor bank 48. Similar to the embodiment discussed with respect to FIG. 4, in some embodiments, a processor 38 receives the neutral-to-ground voltage 54 or a signal 54 corresponding to the neutral-to-ground voltage and analyzes the signal 54 to determine whether the capacitor bank 48 is operating normally, or whether a fault has occurred.

Typically, the normal operating voltage measurement at the node 50 is different depending on the grounding condition of the associated drive. For instance, if the drive is Y-connected, the neutral-to-ground voltage 54 measured from the node 50 is approximately zero when the capacitor bank 48 is operating under normal conditions. If the drive is corner grounded, the neutral-to-ground voltage 54 measured from the node 50 is approximately the input phase voltage, which is typically a fixed voltage. If the neutral-to-ground voltage 54 is not approximately zero and not similar to the input phase voltage, then a fault may be determined to have occurred. In some embodiments, the processor 38 is configured to determine the grounding configuration of the drive and other operating conditions of the drive (e.g., taking a user input of the grounding configuration, measuring drive voltages to determine the grounding configuration, determining the input phase voltage), thereby determining whether a fault has occurred in the capacitor drive 48 based on the specific configuration of the drive. In other embodiments, the processor may simply determine that a fault has occurred if the neutral-to-ground voltage 54 is neither zero nor a fixed voltage.

Figure 7:
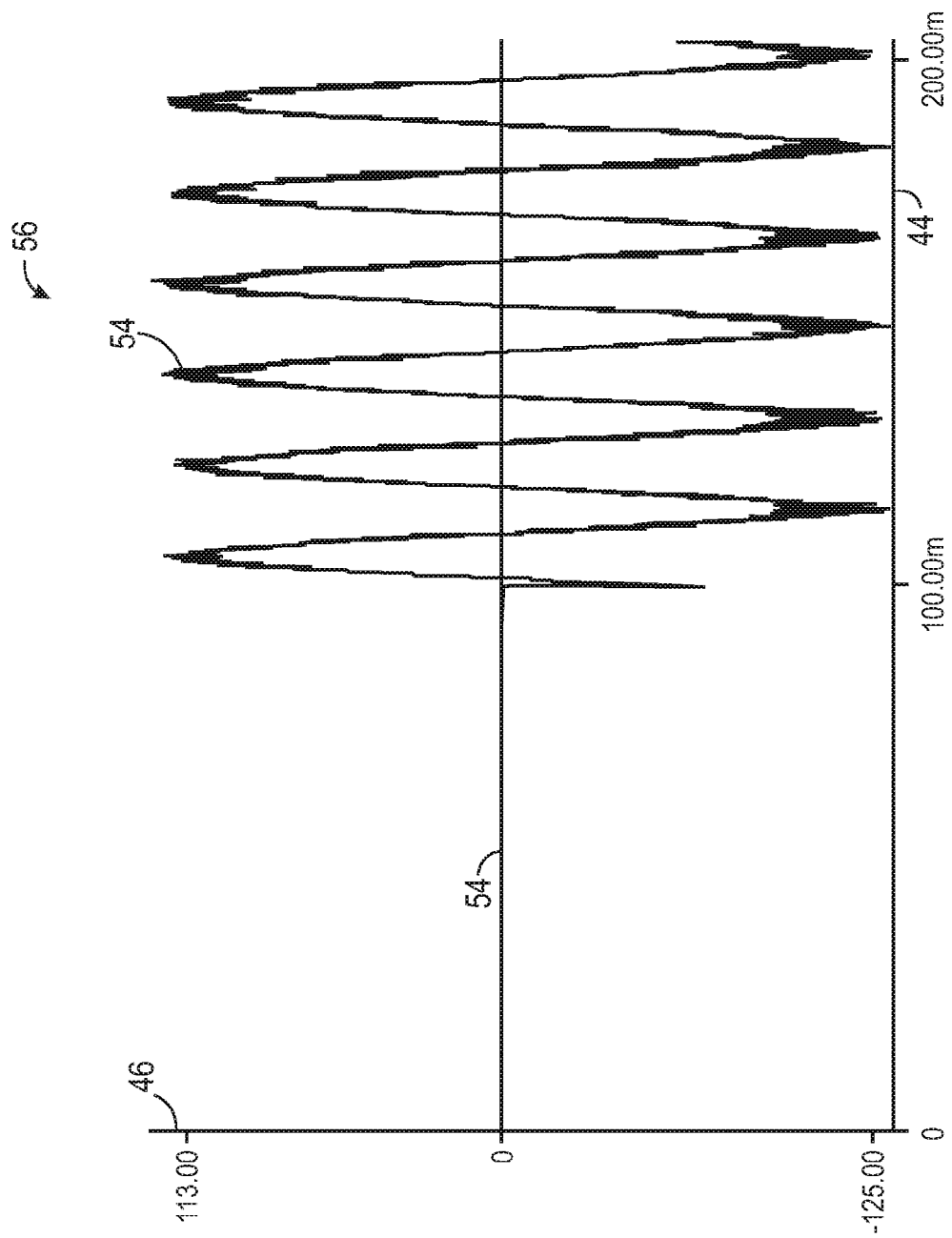
FIG. 7 is a plot representing a voltage condition of a neutral-to-ground node when a capacitor bank unbalance has occurred in the corner connected capacitor bank, wherein the voltage condition is measured from the circuit illustrated in FIG. 6, in accordance with an embodiment of the present techniques.

FIG. 7 is a plot 56 of the neutral-to-ground voltage 54 measured at the node 50 in FIG. 6, with respect to a time axis 44 and a voltage axis 46. Before the 100 ms point, the neutral-to-ground voltage 54 is approximately zero, indicating that the capacitor bank 48 is operating normally. After the 100 ms point, the neutral-to-ground voltage 54 is no longer zero and begins to oscillate between approximately 120V to −120V. This non-zero and non-fixed neutral-to-ground voltage 54 indicates that the capacitor bank 48 is no longer operating normally for either a Y-connected or a corner grounded system. In accordance with present embodiments, the processor 38 detects this change and determines that a fault has occurred.

Another embodiment for detecting unbalances in a capacitor bank of a drive is illustrated in FIG. 8. The embodiment illustrated in FIG. 8 involves using two sets of discharge resistors 32 (e.g. sets of resistors 32a and resistors 32b) to create a neutral node 58 between each of the sets of resistors 32. More specifically, the set of discharge resistors 32a discharge the capacitors 26 in the corner connected capacitor bank 48 and the set of discharge resistors 32b discharge the input power lines 24, creating a neutral node 58 between the discharged sides (e.g., the side of the resistors 32 opposite from the power input lines 24) of each of the sets of resistors 32a and 32b. A voltage measured at the neutral node 58 (e.g., by a voltmeter 36), referred to as a neutral-to-neutral voltage, is analyzed to determine the condition of the capacitor bank 48. A processor 38 receives the neutral-to-neutral voltage 60 or a signal 60 corresponding to the neutral-to-ground voltage and analyzes the signal 60 to determine whether the capacitor bank 48 is operating normally, or whether a fault has occurred.

As the neutral-to-neutral voltage 60 is measured at a neutral node between the two sets of discharge resistors 32, the voltage measurement at the node 58 is approximately zero when the capacitor bank 48 is operating under normal conditions. If the neutral-to-neutral voltage 60 is not approximately zero, then a fault may have occurred. Similar to the embodiments described with respect to FIGS. 4 and 6, the processor 38 is suitable for controlling the measurement of the neutral-to-neutral voltage 60, analyzing the neutral-to-neutral voltage 60, determining whether a fault has occurred, and/or reacting to the fault (e.g., stopping operation of the drive, shunting elements in the drive, indicating the presence of a fault).

FIG. 9 is a plot 62 of the neutral-to-neutral voltage 60 measured at the node 58 in FIG. 8 with respect to the time axis 44 and the voltage axis 46. Before the 100 ms point, the neutral-to-ground voltage 60 is approximately zero, indicating that the capacitor bank 48 is operating normally. After the 100 ms point, the neutral-to-ground voltage 54 is no longer zero and begins to oscillate between approximately 120V to −120V. This non-zero neutral-to-ground voltage 54 indicates that the capacitor bank 48 is no longer operating normally. The processor 38 detects this change and determines that a fault has occurred.

One or more embodiments for detecting unbalances in a capacitor of a drive is illustrated in the flow chart of FIG. 10. As illustrated in FIG. 10, the process 60 begins with configuring discharge resistors on a drive, as represented by block 62. Configuring the discharge resistors includes connecting the discharge resistors to a capacitor bank of the drive, wherein the connected discharge resistors have a resistance suitable for discharging the capacitor bank in a certain amount of time. Each discharge resistor may be connected in series or in parallel to one or more capacitors of the capacitor bank, depending on the configuration of the capacitor bank (e.g., Y-connected, corner connected) and/or the configuration of the associated drive.

The discharge resistors discharge the capacitor bank to create a neutral node on the discharged side of the discharge resistors (e.g., a side opposite from the capacitor bank and/or the power input lines of the drive). The process 60 includes measuring a voltage at this neutral node, as represented by block 64. In different embodiments, the measured voltage may be a neutral-to-ground voltage (as described with respect to FIG. 6) or a neutral-to-neutral voltage (as described with respect to FIGS. 4 and 8). The measured voltage may be different depending on the configuration of the capacitor bank being monitored and/or the configuration of the drive.

The measured voltage is transmitted to a processor of the drive, as represented by block 66. The processor is configured to receive, process, and/or analyze the measured voltage to detect a condition of the capacitor bank based on the measured voltage, as represented by block 68. For instance, the processor may determine that the capacitor bank is operating normally if the measured voltage is approximately zero (or approximately equal to an input phase voltage, in some embodiments). Alternatively, the processor may determine that the capacitor bank is unbalanced. In some embodiments, the processor is also configured to respond to the detected unbalance. For example, in some embodiments, the processor stops the drive from operating, shunts one or more elements of the drive, and/or provides indication of the capacitor bank unbalance to a user of the drive.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A drive, comprising:
   a power converter configured to convert AC power received from a power source to DC power;
   a capacitor bank configured to provide reactive power to the drive, wherein the capacitor bank is coupled between the power source and the power converter, wherein the capacitor bank comprises a plurality capacitors; and
   a plurality of Y-connected discharge resistors configured to discharge the capacitor bank, wherein each discharge resistor of the plurality of Y-connected discharge resistors is connected in series or in parallel to a respective capacitor of the plurality of capacitors in the capacitor bank, and wherein each of the plurality of Y-connected discharge resistors is electrically coupled to a neutral node;
   a first set of inductors directly coupled to the capacitor bank and the power source;
   a second set of inductors directly coupled to the plurality of Y-connected discharge resistors and the power converter.

2. The drive of claim 1, comprising a processor configured to measure the neutral node for a voltage indicative of an operating condition of the capacitor bank.

3. The drive of claim 2, wherein the processor is configured to detect an unbalance when the voltage measured at the neutral node is not zero.

4. The drive of claim 1, comprising an inverter configured to receive the DC power from the power converter and output AC power.

5. The drive of claim 1, wherein each discharge resistor of the plurality of Y-connected discharge resistors is respectively connected in parallel with the respective capacitor of the plurality of capacitors, and wherein the neutral node is between the discharged side of the plurality of discharge resistors and a neutral side of the capacitor bank.

6. The drive of claim 1, wherein each discharge resistor of the plurality of Y-connected discharge resistors is connected in series to the respective capacitor of the plurality of capacitors, and wherein the neutral node is between a discharged side of the plurality of Y-connected discharge resistors and a ground potential.

7. The drive of claim 1, comprising a processor configured to detect an unbalance when a voltage measured at the neutral node is not zero and not equal to an input phase voltage supplied by the power source.

8. The drive of claim 1, comprising an additional plurality of Y-connected discharge resistors configured to discharge input power lines between the power source and the power converter, wherein the additional plurality of discharge resistors is connected in parallel to the plurality of Y-connected discharge resistors.

9. The drive of claim 8, wherein each discharge resistor of the plurality of Y-connected discharge resistors is connected in series to the respective capacitor of the plurality of capacitors, and wherein the neutral node is between a first discharged side of the plurality of Y-connected discharge resistors and a second discharged side of the additional plurality of Y-connected discharge resistors.

10. A method, comprising:
    receiving AC power at a power converter of a drive through power input lines;
    converting the AC power to DC power with the power converter of the drive;
    providing reactive power to the drive via the power input lines with a capacitor bank coupled to the power input lines, wherein the capacitor bank comprises a plurality of capacitors;
    discharging the capacitor bank with a plurality of Y-connected discharge resistors that is directly coupled to the capacitor bank, and wherein each of the plurality of Y-connected discharge resistors is electrically coupled to a neutral node and directly coupled to a set of inductors between the plurality of Y-connected discharge resistors and the power converter;
    receiving, into a processor, a measurement of a voltage associated with the neutral node of the plurality of Y-connected discharge resistors; and
    determining, with the processor, whether an unbalance is present in the capacitor bank based on the measurement of the voltage.

11. The method of claim 10, comprising transmitting the DC power through a DC bus to an inverter of the drive and converting the DC power received via the DC bus to AC power at the inverter.

12. The method of claim 10, comprising measuring the voltage associated with the neutral node by taking a measurement at a measurement node.

13. The method of claim 12, wherein taking the measurement at the measurement node comprises taking a voltage measurement between the neutral node of the plurality of Y-connected discharge resistors and a second neutral node of the capacitor bank.

14. The method of claim 12, wherein determining whether the unbalance is present comprises determining that a neutral-to-neutral voltage measured at the measurement node is not zero.

15. The method of claim 12, wherein taking the measurement at the measurement node comprises taking a voltage measurement between the neutral node of the plurality of Y-connected discharge resistors and a ground potential.

16. The method of claim 12, wherein determining whether the unbalance is present comprises determining that a neutral-to-ground voltage measured at the measurement node is not zero or not equal to an input phase voltage of the drive.

17. The method of claim 12, wherein taking the measurement at the measurement node comprises taking a voltage measurement between the neutral node of the plurality of Y-connected discharge resistors and a second neutral node of an additional plurality of Y-connected discharge resistors, wherein the additional plurality of Y-connected discharge resistors is configured to discharge the power input lines.

18. The method of claim 10, comprising determining that the unbalance is present and initiating deactivation of the drive or shunting of one or more elements of the drive with the processor.

19. The method of claim 10, comprising determining that the unbalance is present and initiating provision of an indication to a user with the processor.

20. A processing system for capacitor bank protection, comprising:
   a processor;
   a capacitor bank comprising a plurality of Y-connected capacitors; and
   a plurality of Y-connected discharge resistors configured to discharge the plurality of Y-connected capacitors of the capacitor bank, wherein each of the plurality of Y-connected discharge resistors and each of the plurality of Y-connected capacitors are electrically coupled to a neutral node;
   a plurality of inductors directly coupled to the plurality of Y-connected discharge resistors and directly coupled to an AC to DC power converter configured to receive an AC voltage from the capacitor bank and output a DC voltage, wherein the processor is configured to receive a measured voltage at the neutral node indicative of an operating condition of the capacitor bank and detect an unbalance of the capacitor bank based on the measured voltage.

21. The processing system for capacitor bank protection of claim 20, comprising:
   the AC to DC power converter configured to convert the AC voltage to the DC voltage;
   a DC bus configured to receive the DC voltage; and
   an inverter configured to convert the DC voltage from the DC bus to output a second AC voltage.

22. The processing system for capacitor bank protection of claim 20, wherein the neutral node is between a discharged side of the plurality of Y-connected discharge resistors and a ground potential.

23. The processing system for capacitor bank protection of claim 20, wherein the processor is configured to detect an unbalance when the measured voltage is not zero.

* * * * *